US011860705B2

(12) United States Patent
Min

(10) Patent No.: US 11,860,705 B2
(45) Date of Patent: Jan. 2, 2024

(54) POWER CONSUMPTION CONTROL METHOD FOR ELECTRONIC DEVICE, ELECTRONIC DEVICE, AND STORAGE MEDIUM

(71) Applicant: VIVO MOBILE COMMUNICATION CO., LTD., Guangdong (CN)

(72) Inventor: Deshun Min, Guangdong (CN)

(73) Assignee: VIVO MOBILE COMMUNICATION CO., LTD., Guangdong (CN)

( * ) Notice: Subject to any disclaimer, the term of this patent is extended or adjusted under 35 U.S.C. 154(b) by 0 days.

(21) Appl. No.: 17/733,371

(22) Filed: Apr. 29, 2022

(65) Prior Publication Data

US 2022/0261058 A1  Aug. 18, 2022

Related U.S. Application Data

(63) Continuation of application No. PCT/CN2020/123323, filed on Oct. 23, 2020.

(30) Foreign Application Priority Data

Oct. 30, 2019  (CN) .......................... 201911046267.3

(51) Int. Cl.
*G06F 1/3206* (2019.01)
*H03M 1/06* (2006.01)

(52) U.S. Cl.
CPC ........ *G06F 1/3206* (2013.01); *H03M 1/0658* (2013.01)

(58) Field of Classification Search
CPC ............................ G06F 1/3206; H03M 1/0658
See application file for complete search history.

(56) References Cited

U.S. PATENT DOCUMENTS

| 6,842,478 | B1 | 1/2005 | Ogino | |
| 8,769,326 | B2* | 7/2014 | Liu | G06F 1/3234 713/323 |
| 2005/0015636 | A1* | 1/2005 | Chen | G06F 1/3203 713/323 |
| 2006/0090090 | A1* | 4/2006 | Perng | G06F 1/24 713/320 |

(Continued)

FOREIGN PATENT DOCUMENTS

| CN | 202854702 U | 4/2013 |
| CN | 103853309 A | 6/2014 |

(Continued)

OTHER PUBLICATIONS

First Office Action for Chinese Application No. 201911046267.3, dated Mar. 3, 2021, 6 Pages.

(Continued)

*Primary Examiner* — Gary Collins
(74) *Attorney, Agent, or Firm* — BROOKS KUSHMAN P.C.

(57) ABSTRACT

A power consumption control method for an electronic device, an electronic device, and a storage medium, and the method includes: obtaining a current state of the electronic device; determining a target integration time of an ADC sampling circuit based on the obtained current state; and adjusting an integration time of the ADC sampling circuit to the target integration time, and adjusting a power-on time of a hidden function key based on the adjusted integration time to control actual power consumption of the electronic device, wherein the integration time is positively correlated with the power-on time.

20 Claims, 8 Drawing Sheets

(56) References Cited

U.S. PATENT DOCUMENTS

| | | | |
|---|---|---|---|
| 2010/0009643 A1 | 1/2010 | Haartsen | |
| 2012/0233483 A1* | 9/2012 | Liu | G06F 1/3234 |
| | | | 713/323 |
| 2015/0012769 A1* | 1/2015 | Koga | G06F 3/1229 |
| | | | 713/323 |
| 2015/0061701 A1* | 3/2015 | Fujii | G06F 1/3262 |
| | | | 324/658 |
| 2016/0187955 A1* | 6/2016 | Kawaura | G06F 1/3209 |
| | | | 713/310 |

FOREIGN PATENT DOCUMENTS

| | | |
|---|---|---|
| CN | 104615415 A | 5/2015 |
| CN | 106506821 A | 3/2017 |
| CN | 110347236 A | 10/2019 |
| CN | 110784915 A | 2/2020 |
| EP | 1039648 A3 | 11/2003 |
| EP | 1962171 A2 | 8/2008 |
| WO | 2010004441 A1 | 1/2010 |

OTHER PUBLICATIONS

International Search Report and Written Opinion for Application No. PCT/CN2020/123323, dated Jan. 26, 2021, 8 Pages.
Yimin, Wu, "The Research and Implementation of Capacitive Touch Sensor-Based on Third-order Sigma-Delta ADC," Master of National Defense University of Science and Technology, Mar. 2014, Changsha, Hunan, China, 81 Pages.
First Office Action for Indian Application No. 202227028544, dated Oct. 21, 2022, 6 Pages (including English Translation).

* cited by examiner

POWER CONSUMPTION CONTROL METHOD FOR ELECTRONIC DEVICE, ELECTRONIC DEVICE, AND STORAGE MEDIUM

CROSS-REFERENCE TO RELATED APPLICATIONS

This application is a continuation of International Application No. PCT/CN2020/123323 filed on Oct. 23, 2020, which claims priority to Chinese Patent Application No. 201911046267.3, filed on Oct. 30, 2019, which are incorporated herein by reference in their entireties.

TECHNICAL FIELD

This application relates to the field of electronic device technologies, and in particular, to a power consumption control method for an electronic device, an electronic device, and a storage medium.

BACKGROUND

At present, some electronic devices replace physical keys with hidden function keys, that is, a sensor is implanted in the smartphone, the sensor is used to detect an excitation signal received at a preset position, and then a function of a hidden function key corresponding to the preset position is triggered.

However, currently, power consumption of the current hidden function key circuit is relatively large, and there is unreasonable consumption, resulting in a decrease in the use time and over-discharge of the battery. Although actual power consumption of the electronic device may be reduced by reducing a sensor scanning frequency of the hidden function key, it will also affect a response speed of the hidden function key, thus it is impossible to ensure the response speed of the hidden function key and the actual power consumption of the electronic device at the same time.

SUMMARY

Embodiments of this application are intended to provide a power consumption control method for an electronic device, an electronic device, and a storage medium.

According to a first aspect, an embodiment of this application provides a power consumption control method for an electronic device, applied to an electronic device with a hidden function key, where the method includes:
  obtaining a current state of the electronic device, where the current state includes: a shutdown state, a standby state, and a use state;
  determining a target integration time of an ADC sampling circuit in the electronic device based on the current state; and
  adjusting an integration time of the ADC sampling circuit to the target integration time, and adjusting a power-on time of the hidden function key based on the adjusted integration time to control actual power consumption of the electronic device, where the integration time is positively correlated with the power-on time.

According to a second aspect, an embodiment of this application provides an electronic device, including: hidden function key circuits and a processor, where
  the hidden function key circuits include: a sub-control circuit, and a plurality of key sensors electrically connected to the sub-control circuit, an amplification filter circuit, and an ADC sampling circuit,
  the sub-control circuit is configured to:
  obtain a current state of the electronic device transmitted by the processor, where the current state includes: a shutdown state, a standby state, and a use state;
  determine a target integration time of the ADC sampling circuit based on the current state; and
  adjust an integration time of the ADC sampling circuit to the target integration time, and adjust a power-on time of the hidden function key based on the adjusted integration time to control actual power consumption of the electronic device, where the integration time is positively correlated with the power-on time.

According to a third aspect, an embodiment of this application provides an electronic device, including a memory, a processor, and a computer program stored in the memory and executable on the processor, where when the computer program is executed by the processor, steps of the power consumption control method for an electronic device according to the first aspect are implemented.

According to a fourth aspect, an embodiment of this application provides a computer readable storage medium, where the computer readable storage medium stores a computer program, and when the computer program is executed by a processor, steps of the power consumption control method for an electronic device according to the first aspect are implemented.

According to the power consumption control method for an electronic device and the electronic device in the embodiments of this application, the method includes: obtaining a current state of the electronic device; determining a target integration time of an ADC sampling circuit based on the obtained current state; and adjusting an integration time of the ADC sampling circuit to the target integration time, and adjusting a power-on time of a hidden function key based on the adjusted integration time to control actual power consumption of the electronic device, where the integration time is positively correlated with the power-on time. In the embodiments of this application, the integration time of the ADC sampling circuit is adjusted in combination with the current state of the electronic device to adjust an on-off time of a power-consuming module in the hidden function key circuit, so as to reduce unnecessary power consumption of the electronic device. In this way, there is no need to change the sensor scanning frequency of the hidden function key, so that response sensitivity of the hidden function key can be ensured while the scanning frequency is kept unchanged, and the actual power consumption of the electronic device can also be reduced, thereby prolonging a standby time and a service life of the electronic device.

BRIEF DESCRIPTION OF DRAWINGS

To describe the solutions in the embodiments of this application or in the prior art more clearly, the following briefly describes the accompanying drawings required for describing the embodiments or the prior art. Apparently, the accompanying drawings in the following description show some embodiments of this application, and a person of ordinary skill in the art may still derive other drawings from these accompanying drawings without creative efforts.

DETAILED DESCRIPTION

To enable a person skilled in the art to better understand the embodiments in this application, the following clearly and completely describes the embodiments of this application with reference to the accompanying drawings in the embodiments of this application. Apparently, the described embodiments are merely some rather than all of the embodiments of this application. Based on the embodiments of this application, all other embodiments obtained by a person of ordinary skill in the art without creative efforts shall fall within the protection scope of this application.

The embodiments of this application provide a power consumption control method for an electronic device and an electronic device. The integration time of the ADC sampling circuit is adjusted in combination with the current state of the electronic device to adjust an on-off time of a power-consuming module in the hidden function key circuit, so as to reduce unnecessary power consumption of the electronic device. In this way, there is no need to change the sensor scanning frequency of the hidden function key, so that response sensitivity of the hidden function key can be ensured while the scanning frequency is kept unchanged, and the actual power consumption of the electronic device can also be reduced, thereby prolonging a standby time and a service life of the electronic device.

Figure 1:
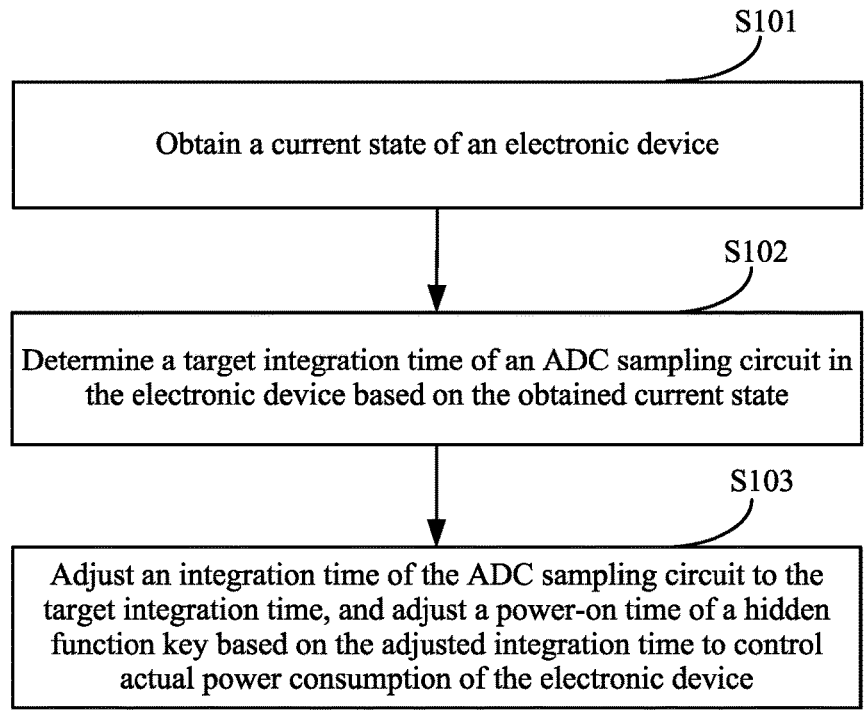
FIG. 1 is a schematic flowchart of a first embodiment of a power consumption control method for an electronic device according to a first aspect of this application.

FIG. 1 is a schematic flowchart of a first embodiment of a power consumption control method for an electronic device according to a first aspect of this application. The method in FIG. 1 can be executed by the electronic device, in particular, can be executed by a program module set in the electronic device, and Optionally, may be executed by a sub-control circuit in a hidden function key circuit, and may also be executed by a processor in the electronic device, where the sub-control circuit may be independent of the processor, or may also be set in the processor. As shown in FIG. 1, the method includes at least the following steps.

S101. Obtain a current state of the electronic device, where the current state includes: a shutdown state, a standby state, or a use state.

The current state represents a current use state of the electronic device, and the current use state may be the shutdown state, the standby state, or the use state (namely, a normal operating state). For a case that an execution subject is the sub-control circuit, the current state may be transmitted to the sub-control circuit by the processor in the electronic device. The sub-control circuit exchanges data with the processor through an IO interface or a preset communication protocol. Optionally, the processor may automatically report the current state to the sub-control circuit when a change in the use status of the electronic device is detected. That is, the sub-control circuit receives the current state of the electronic device transmitted by the processor through the IO interface or the preset communication protocol, so that the sub-control circuit does not need to detect whether the use state is changed in real time, thereby reducing an information processing amount of the sub-control circuit.

The method shown in FIG. 1 further includes the following steps.

S102. Determine a target integration time of an ADC sampling circuit in the electronic device based on the obtained current state.

The ADC sampling circuit is an integral ADC sampling circuit. The longer the integration time of the integral ADC sampling circuit is, the higher the signal processing accuracy is. Considering that the electronic device has different requirements on accuracy of an analog signal processed by the ADC sampling circuit under different use states, different integration times of the ADC sampling circuit are set according to the requirements for the accuracy of the electronic device under different use states. If an accuracy requirement corresponding to the current use state is relatively high, the integration time of the ADC sampling circuit is increased, and if the accuracy requirement corresponding to the current use state is relatively low, the integration time of the ADC sampling circuit is reduced.

For example, when the electronic device is in the shutdown state, it only needs to detect a trigger of an external excitation signal. Since the accuracy requirement for an analog signal converted from the external excitation signal is not high, a target integration time corresponding to the shutdown state is less than a target integration time corresponding to the use state.

In an optional implementation, a first correspondence between the use state of the electronic device and the target integration time may be pre-established and stored, and subsequently in a power consumption control stage of the electronic device, the target integration time corresponding to the current state of the electronic device is determined based on the pre-stored first correspondence.

The method shown in FIG. 1 further includes the following steps.

S103. Adjust an integration time of the ADC sampling circuit to the target integration time, and adjust a power-on time of the hidden function key based on the adjusted integration time to control actual power consumption of the electronic device, where the integration time is positively correlated with the power-on time.

Considering that the longer the integration time of the ADC sampling circuit is, the higher the signal processing accuracy is, while the longer the power-on time of the power-consuming modules (for example, the key sensor and the signal processing circuit) takes, the higher the power consumption of the electronic device has; since accuracy requirements in the shutdown state and the standby state are not high, the integration time of the ADC sampling circuit may be appropriately shortened. The target integration time corresponding to the shutdown state or the standby state is less than the target integration time corresponding to the use state, that is, the integration time of the ADC sampling circuit is reduced as for the shutdown state or the standby state, thus the shorter the integration time of the ADC sampling circuit is, the shorter the power-on time of the power-consuming module is, and correspondingly, the longer the power-off time of the power-consuming module is. In this way, the scanning cycle remains unchanged, and the actual power consumption of the electronic device is reduced when it is ensured that the scanning frequency remains unchanged.

Therefore, the integration time of the ADC sampling circuit is adjusted automatically in combination with the current state of the electronic device, and the integration time of the ADC sampling circuit is adjusted to the target integration time corresponding to the current state. In this way, the response sensitivity of the hidden function key can be ensured, and the signal processing accuracy can be ensured in the use state, and the purpose of reducing the power consumption in the shutdown state or the standby state of the electronic device can be achieved at the same time.

In the embodiments of this application, the integration time of the ADC sampling circuit is adjusted in combination with the current state of the electronic device to adjust an on-off time of a power-consuming module in the hidden function key circuit, so as to reduce unnecessary power consumption of the electronic device. In this way, there is no need to change the sensor scanning frequency of the hidden function key, so that response sensitivity of the hidden function key can be ensured while the scanning frequency is kept unchanged, and the actual power consumption of the electronic device can also be reduced, thereby prolonging a standby time and a service life of the electronic device.

Figure 2:
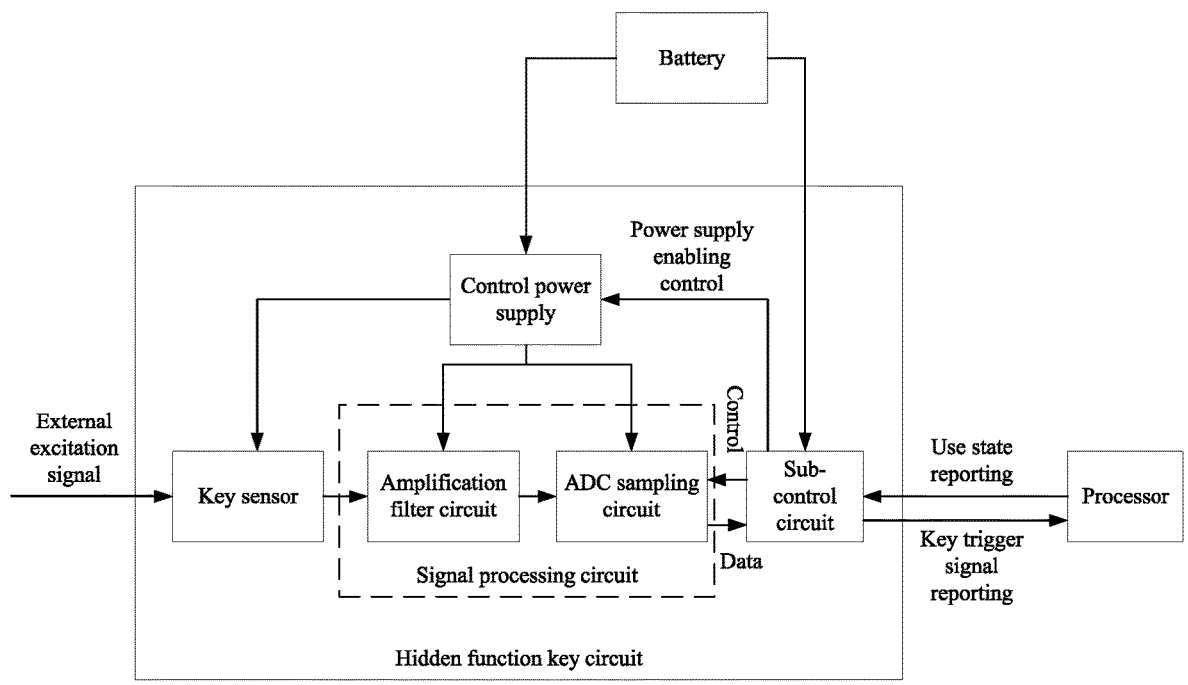
FIG. 2 is a schematic diagram of a circuit structure of an exemplary electronic device that can implement a power consumption control method for an electronic device shown in FIG. 1.

In a specific embodiment, as shown in FIG. 2, a schematic diagram of a circuit structure of an exemplary electronic device that can implement a power consumption control method for an electronic device shown in FIG. 1 is provided. The electronic device includes: a hidden function key circuit, a processor, and a battery, where the hidden function key circuit includes: a sub-control circuit, a signal processing circuit, a key sensor and a control power supply, and the signal processing circuit includes: an amplification filter circuit and an ADC sampling circuit. For example, the key sensor may be a pressure sensor, and may also be a capacitive sensor or an inductive sensor.

Optionally, when detecting that the use state of the electronic device changes, the processor uploads the detected current state of the electronic device to the sub-control circuit; the sub-control circuit receives the current state through an IO interface or a preset communication protocol.

The sub-control circuit determines the target integration time of the ADC sampling circuit based on the received current state of the electronic device; and adjusts the integration time of the ADC sampling circuit to the target integration time to control the power-on time of at least one power-consuming module in the key sensor, the amplification filter circuit, and the ADC sampling circuit, where the integration time is positively correlated with the power-on time, and correspondingly, the power-off time thereof also changes, so that the scanning frequency of the hidden function key circuit remains unchanged. In this way, the power consumption of the electronic device in the shutdown state or the standby state can be reduced on the premise of ensuring the response sensitivity of the hidden function key.

In an optional implementation, the sub-control circuit is provided with a timer, and the timer is used for timing control on the scanning cycle of the hidden function key circuit. The scanning cycle may include: the power-on time and the power-off time; the sub-control circuit controls the on-off of at least one power-consuming module in the key sensor, the amplification filter circuit, and the ADC sampling circuit through the timer and the control power supply, so as to adjust a power-on time of at least one power-consuming module in the key sensor, the amplification filter circuit, and the ADC sampling circuit in each scanning cycle, and adjust a power-off time thereof; the power-on time in each scanning cycle is equal to a sum of the integration time of the ADC sampling circuit, a power-on stabilization time, and a preset signal processing time, the integration time is related to the current state, and both the power-on stabilization time and the preset signal processing time are fixed values; the power-off time in each scanning cycle is equal to the scanning cycle minus the power-on time, and the scanning cycle remains unchanged, that is, the scanning frequency remains unchanged. Therefore, the shorter the integration time is, the shorter the power-on time is, and the longer the power-off time is.

Optionally, during the power-on time in each scanning cycle, the key sensor is used to collect the external excitation signal, and convert the collected external excitation signal into an analog signal; the signal processing circuit is used to perform amplification, filtering, and integration processing on the analog signal, and upload a digital signal obtained from the processing to the sub-control circuit. At this time, the key sensor, the amplification filter circuit, and the ADC sampling circuit must be powered on.

Correspondingly, during the power-off time in each scanning cycle, the sub-control circuit mainly performs signal processing and data reporting. At this time, the key sensor, the amplification filter circuit, and the ADC sampling circuit may not be powered on; Optionally, the sub-control circuit transmits a key trigger signal in the form of a digital signal to the processor, so that the processor determines a hidden function key for touch control based on the key trigger signal, and executes a corresponding key function.

In other words, as for different use states of the electronic device, in a case that the scanning frequency remains unchanged, that is, the scanning cycle remains unchanged, the sub-control circuit adjusts the integration time of the ADC sampling circuit to control the power-on time of the key sensor, the amplification filter circuit, and the ADC sampling circuit, and control the power-off time thereof; in the shutdown state or the standby state, the integration time is reduced, the power-on time is reduced, and correspondingly, the power-off time is increased, while in the use state, the integration time is increased, the power-on time is increased, and correspondingly, the power-off time is reduced.

Optionally, when the electronic device changes from a switch-on state to the shutdown state, the sub-control circuit reduces the integration time of the ADC sampling circuit because the accuracy requirement on the analog signal converted by the ADC sampling circuit is reduced in the shutdown state, thereby reducing the power-on time of the key sensor, the amplification filter circuit, and the ADC sampling circuit, and the power-off time of the key sensor, the amplification filter circuit, and the ADC sampling circuit is increased. This effectively reduces the actual power consumption of the hidden function key circuit in the shutdown state or the standby state.

For example, for each scanning cycle, if the power-on time is t1-t2, the power-off time is t2-t3, that is, the scanning cycle is t1-t3; if the current state of the electronic device is switched from the switch-on state to the shutdown state, the integration time of the ADC sampling circuit is reduced, correspondingly, the power-on time t1-t2 of the key sensor, the amplification filter circuit, and the ADC sampling circuit is reduced, and the power-off time t2-t3 of the key sensor, the amplification filter circuit, and the ADC sampling circuit is increased, while the scanning cycle t1-t3 of the hidden function key circuit remains unchanged, that is, the scanning frequency of the hidden function key circuit remains unchanged. However, since the power-on time t1-t2 is reduced, the actual power consumption of the hidden function key circuit in the shutdown state or the standby state is effectively reduced.

Figure 3:
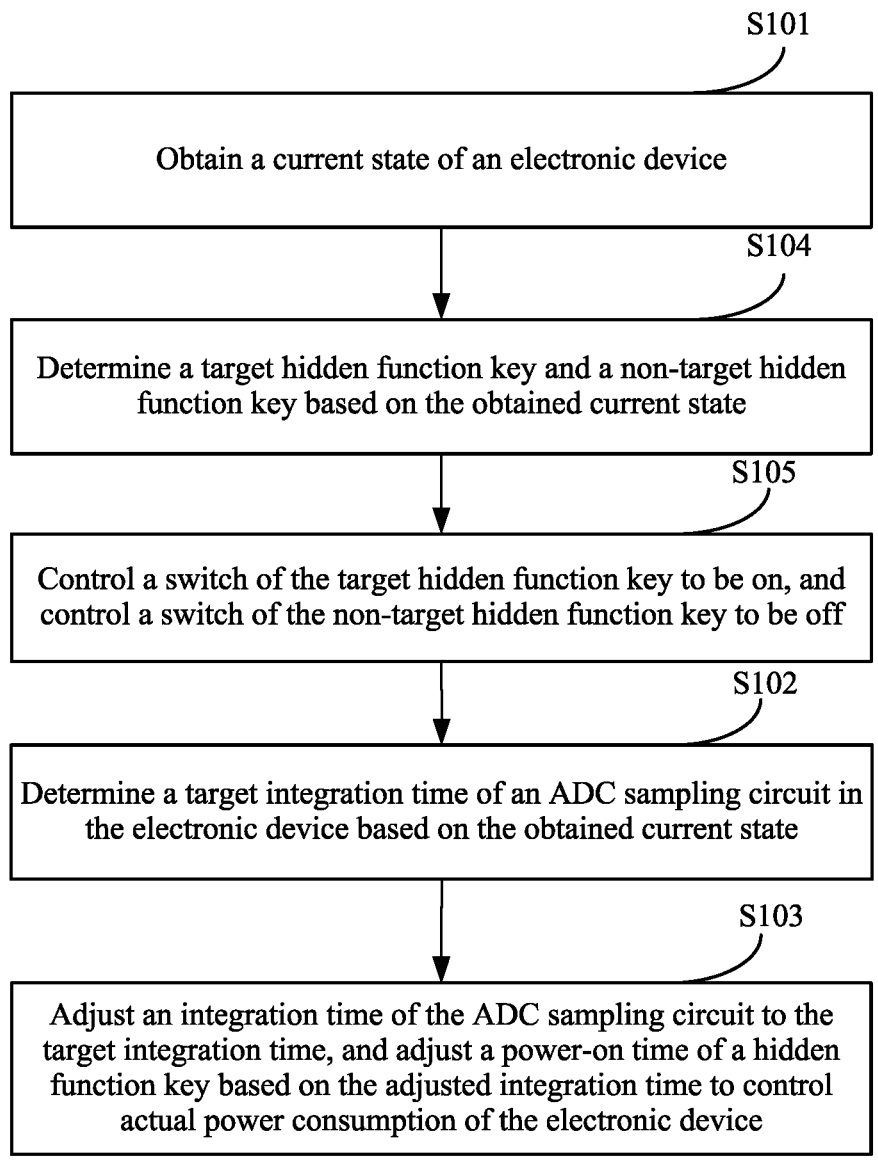
FIG. 3 is a schematic flowchart of a second embodiment of a power consumption control method for an electronic device according to a first aspect of this application.

Further, considering that types of hidden function keys required to be used are different for different use states of the electronic device, each hidden function key may be controlled individually to be on or off by setting a control switch for each hidden function key. Only a hidden function key that may be used in the current use state is powered, and a hidden function key that is not needed in the current use state is not powered, thereby further reducing unnecessary power consumption of the electronic device. Based on this, as shown in FIG. 3, after the obtaining a current state of the electronic device in S101, the method further includes the following step.

S104. Determine a target hidden function key and a non-target hidden function key based on the obtained current state.

In an optional implementation, among the plurality of hidden function keys in the electronic device, target hidden function keys may be determined first, and other hidden function keys are determined as non-target hidden function keys, or non-target hidden function keys may be determined first, and remaining hidden function keys are determined as target hidden function keys, and target hidden function keys and non-target hidden function keys may also be determined at the same time.

The hidden function key may include: at least one of a hidden volume up key, a hidden volume down key, and a hidden power key; the target hidden function key refers to the hidden function key that may be used in the current use state, and correspondingly, the non-target hidden function key refers to the hidden function key that is not needed in the current use state.

In an optional implementation, a second correspondence between the use state of the electronic device and the target hidden power key may be pre-established and stored, and subsequently in a power consumption control stage of the electronic device, the target hidden power key corresponding to the current state of the electronic device is determined based on the pre-stored second correspondence. Correspondingly, other hidden function keys are non-target hidden function keys.

As shown in FIG. 3, after the obtaining a current state of the electronic device in S101, the power consumption control method for an electronic device further includes the following step.

S105. Control a switch of the target hidden function key to be on, and control a switch of the non-target hidden function key to be off.

Optionally, the switch of the hidden function key may be a mechanical switch or an enabling control power supply, and a sensor corresponding to each hidden function key is individually controlled to be powered on or powered off through the switch; when it is determined that a specific hidden function key is the target hidden function key, a switch of the sensor corresponding to the target hidden function key is controlled to be on, and the sensor is powered on, so that the sensor collects the excitation signal; at the same time, for the non-target hidden function key, that is, the hidden function key that does not need to be triggered in the current use state, the switch of the sensor corresponding to the non-target hidden function key is controlled to be off, thereby controlling the power consumption of the non-target hidden function key circuit.

Figure 4:
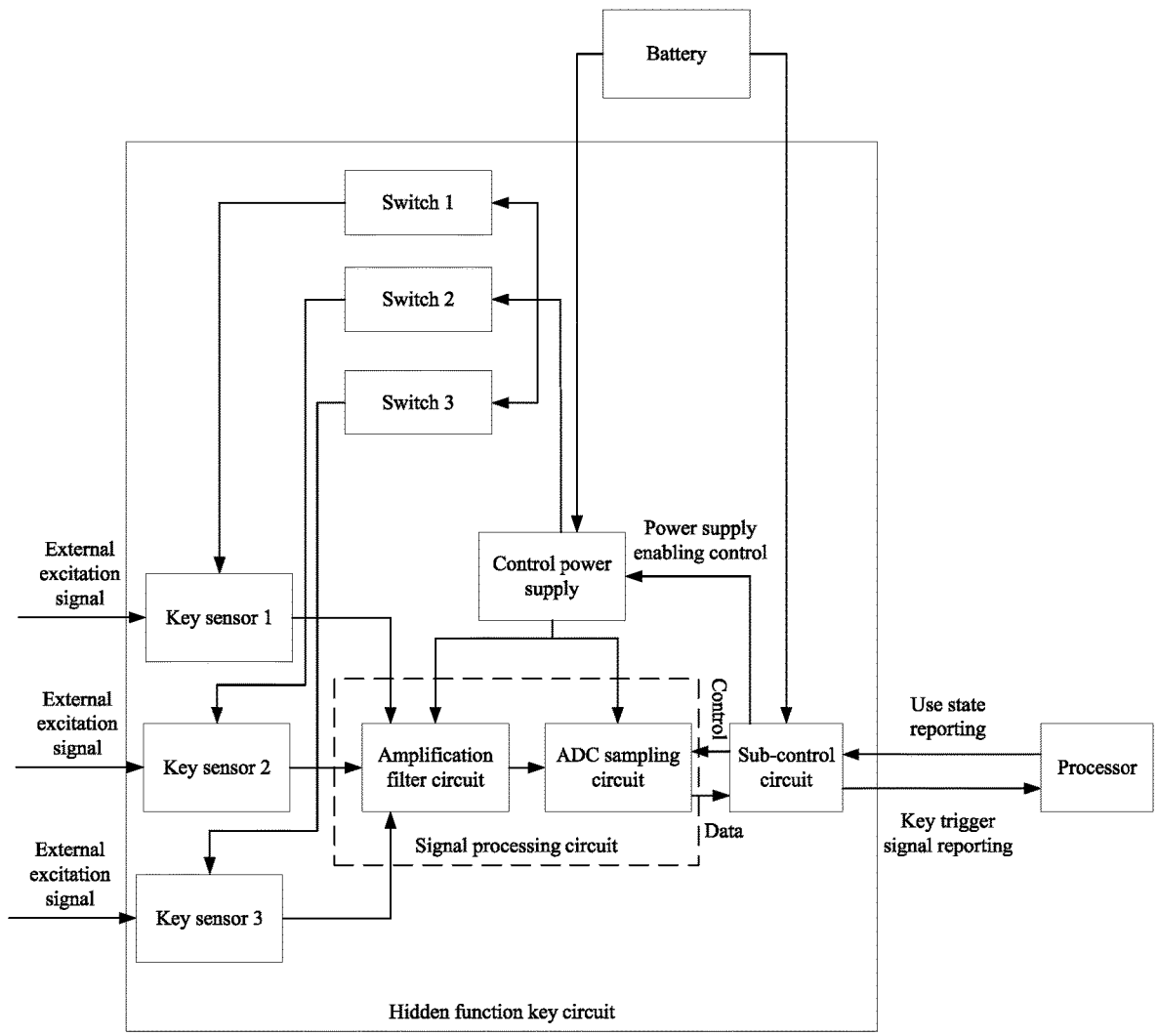
FIG. 4 is a schematic diagram of a circuit structure of an exemplary electronic device that can implement a power consumption control method for an electronic device shown in FIG. 3.

In an optional embodiment, as shown in FIG. 4, a schematic diagram of a circuit structure of an exemplary electronic device that can implement a power consumption control method for an electronic device shown in FIG. 3 is provided. On the basis of the FIG. 2, the electronic device further includes: a plurality of switches for controlling on-off of the key sensor, and the switches are in one-to-one correspondence with the hidden function keys.

In FIG. 4, the plurality of key sensors include: a key sensor 1 corresponding to the hidden power key, a key sensor 2 corresponding to the hidden volume up key, or a key sensor 3 corresponding to the hidden volume down key; the key sensors may include one sensor element, and in order to improve key sensitivity, the key sensors may also include a plurality of sensor elements; therefore, in an optional implementation, combined with actual requirements of each hidden function key for sensitivity, the corresponding key sensor may include different quantities of sensor elements; for example, if the sensitivity requirement of the hidden power key is higher than that of the hidden volume up key and the hidden volume down key, at this time, the key sensor corresponding to the hidden power key may be set to include 3 sensor elements, and key sensors respectively corresponding to the hidden volume up key and the hidden volume down key are set to include two sensor elements.

Optionally, the key sensor 1 is corresponding to a switch 1, the key sensor 2 is corresponding to a switch 2, and the key sensor 3 is corresponding to a switch 3. If the hidden power key is the target hidden function key and the hidden volume up key and the hidden volume down key are non-target hidden function keys, then the switch 1 is set to on, so as to power on the key sensor 1, and the switch 2 and the switch 3 are set to off so as to power off the key sensor 2 and the key sensor 3, thereby reducing unnecessary power consumption of the electronic device.

As for the implementation of reducing the actual power consumption of the electronic device by adjusting the integration time of the ADC sampling circuit, it is necessary to determine the target integration time corresponding to the current state. Optionally, the determining a target integration time of an ADC sampling circuit in the electronic device based on the obtained current state in S102 optionally includes:
  if the current state of the electronic device is the use state, determining a first integration time as the target integration time of the ADC sampling circuit in the electronic device;
  if the current state of the electronic device is the standby state, determining a second integration time as the target integration time of the ADC sampling circuit in the electronic device; and if the current state of the electronic device is the shutdown state, determining a third integration time as the target integration time of the ADC sampling circuit in the electronic device, where the first integration time is greater than the second integration time, and the second integration time is greater than the third integration time.

Optionally, due to different accuracy requirements for the analog signal processed by the ADC sampling circuit under different use states of the electronic device, the integration time of the ADC sampling circuit may be adjusted accordingly. The higher the accuracy requirement is, the longer the integration time of the ADC sampling circuit is. Since three states: the use state, the standby state, and the shutdown state have lower accuracy requirements in turn, the first integration time corresponding to the use state is greater than the second integration time corresponding to the standby state, and the second integration time corresponding to the standby state is greater than the third integration time corresponding to the shutdown state.

Optionally, the power-on time of the signal processing circuit and the key sensor mainly includes three parts: a power-on stabilization time of the hidden function key circuit, an ADC integration time, a signal transmission time, and a power-off time equal to the scanning cycle minus the power-on time, where the scanning cycle remains unchanged; when state information of the electronic device changes, the hidden function key circuit has different requirements on the accuracy of the analog signal processed by the ADC sampling circuit, and therefore, the integration time of the ADC sampling circuit may be adjusted accordingly, further, the power-on time of the signal processing circuit and the key sensor is adjusted, and the power-off time of the signal processing circuit and the key sensor is adjusted, thereby reducing the power consumption of the hidden function key circuit in the shutdown state or the standby state.

For example, when the electronic device is currently in the use state, the power-on stabilization time of the signal processing circuit and the key sensor is 5 ms, the integration time of the ADC sampling circuit is 10 ms, the signal transmission time is 5 ms, and the power-up time in each scanning cycle is 20 ms.

Correspondingly, when the electronic device is currently in the standby state, the power-on stabilization time of the signal processing circuit and the key sensor is 5 ms, the integration time of the ADC sampling circuit is 5 ms, the signal transmission time is 5 ms, and the power-up time in each scanning cycle is 15 ms.

Correspondingly, when the electronic device is currently in the shutdown state, the power-on stabilization time of the signal processing circuit and the key sensor is 5 ms, the integration time of the ADC sampling circuit is 1 ms, the signal transmission time is 5 ms, and the power-up time in each scanning cycle is 11 ms.

Therefore, in different use states of the electronic device, the power-on time of the signal processing circuit and the key sensor can be controlled by adjusting the integration time of the ADC sampling circuit, thereby reducing the power consumption of the hidden function key circuit in the shutdown state or the standby state.

In view of the method of realizing individual on-off control of each hidden function key by setting a control switch for each hidden function key, it is necessary to determine a target hidden function key and a non-target hidden function key corresponding to the current state. Optionally, the determining a target hidden function key and a non-target hidden function key based on the obtained current state in S104 Optionally includes:

if the current state of the electronic device is the use state, determining all the hidden power key, the hidden volume up key, and the hidden volume down key as target hidden function keys.

Optionally, as for the electronic device in the use state, the user may not only realize a power-off function by touching the hidden power key, but also may increase or decrease a playback volume by touching the hidden volume up key and the hidden volume down key, therefore, switches of the hidden power key, the hidden volume up key, and the hidden volume down key need to be set to on, so that external excitation signals can be collected in time.

If the current state of the electronic device is the standby state or the shutdown state, the hidden power key is determined as the target hidden function key, and the hidden volume up key and the hidden volume down key are determined as non-target hidden function keys.

Optionally, as for the electronic device in the standby state or the shutdown state, the user may only need to touch the hidden power key to realize a power-on function, therefore, the switch of the hidden power key needs to be set to on, so that external excitation signals can be collected in time.

In an optional implementation, when the electronic device is currently in the use state, considering that the hidden volume up key, the hidden volume down key, and the hidden power key may be used, it is necessary to control switches respectively corresponding to the hidden volume up key, the hidden volume down key, and the hidden power key to be on, so that corresponding key sensors can collect external excitation signals; when the electronic device is currently in the standby state or the shutdown state, considering that only the hidden power key may be used, therefore, only a switch corresponding to the hidden power key needs to be controlled to be on, so that a corresponding key sensor can collect external excitation signals. At the same time, switches of other hidden function keys are controlled to be off, thereby reducing the power consumption of the hidden function key circuit in the shutdown state or the standby state.

Optionally, considering that there may be inaccurate control in each scanning cycle, in order to ensure that a sum of the power-on time and the power-off time in each scanning cycle remains unchanged, thereby ensuring that the scanning frequency remains unchanged, a scanning cycle detection mechanism is added to monitor in real time whether each scanning cycle remains unchanged. Based on this, after the step S103, the method further includes:

obtaining a power-on time and a power-off time of a key sensor of a hidden function key in each scanning cycle; and if a sum of the power-on time and the power-off time is not equal to a preset time threshold, triggering the processor to prompt an abnormality.

Figure 5:
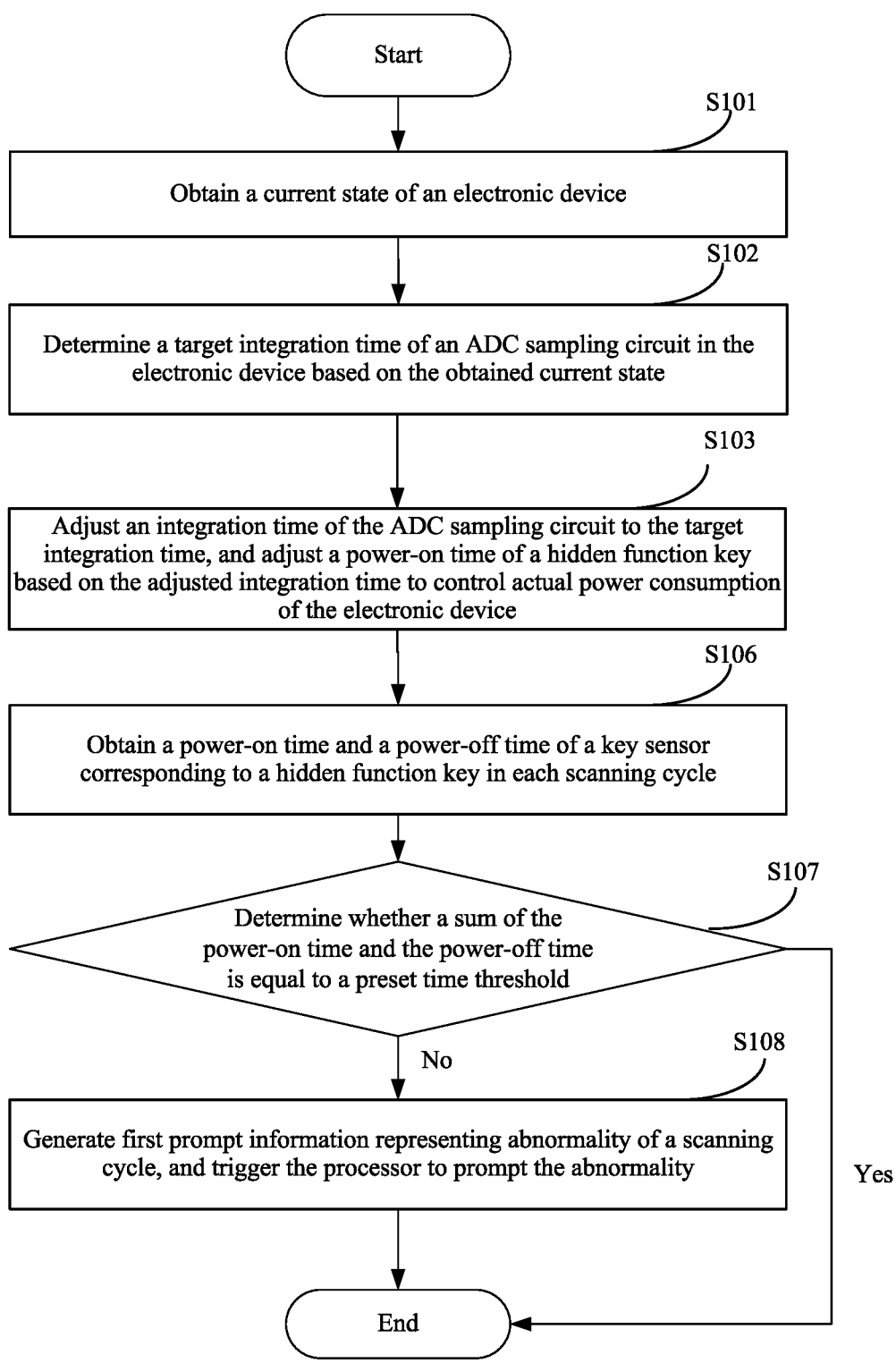
FIG. 5 is a schematic flowchart of a third embodiment of a power consumption control method for an electronic device according to a first aspect of this application.

In an optional implementation, the detection process of the scanning cycle may be performed by the sub-control circuit or the processor. In order to reduce change of a processing program of the processor, the scanning cycle detection performed by the sub-control circuit is used as an example. As shown in FIG. 5, after the adjusting an integration time of the ADC sampling circuit to the target integration time, and adjusting a power-on time of the hidden function key based on the adjusted integration time to control actual power consumption of the electronic device in S103, the power consumption control method for an electronic device further includes the following steps.

S106. Obtain a power-on time and a power-off time of a key sensor of a hidden function key in each scanning cycle.

S107. Determine whether a sum of the power-on time and the power-off time is equal to a preset time threshold.

If a determination result is no, then S108. generating first prompt information representing abnormality of the scanning cycle, and triggering the processor to prompt the abnormality is executed; Optionally, the first prompt information may be transmitted to the processor, so that the processor determines a cause of the abnormality and prompts the abnormality, and adjusts the parameters of the sub-control circuit based on the cause of the abnormality.

Optionally, the sub-control circuit controls the on-off of at least one power-consuming module in the key sensor, the amplification filter circuit, and the ADC sampling circuit through a timer and a control power supply, so as to adjust a power-on time of at least one power-consuming module in the key sensor, the amplification filter circuit, and the ADC sampling circuit in each scanning cycle, and adjust a power-off time thereof, where a sum of the power-on time and the power-off time is the scanning cycle of the hidden function key circuit, and the scanning cycle should remain unchanged; if the sum of the power-on time and the power-off time changes and is inconsistent with the preset scanning cycle, it means that the control on the scanning cycle is abnormal, and the timer may fail at this time, thus corresponding abnormal prompt information is automatically generated and transmitted to the processor, so that the processor automatically adjusts relevant parameters of the timer in combination with specific abnormal causes; besides, when a quantity of abnormal control in the scanning cycle is greater than the preset threshold, it means that the processor cannot automatically correct the relevant parameters, and the user may be prompted to carry out maintenance at a maintenance point.

Further, considering that there may be inaccurate control of the power-on time in each scanning cycle, in order to ensure that the power-on time in each scanning cycle matches the current use state of the electronic device, a power-on time detection mechanism for different use states is added to monitor in real time whether the control on the power-on time is accurate. Based on this, after the step S103, the power consumption control method for an electronic device further includes:

obtaining a first power-on time of each scanning cycle in the shutdown state, and obtaining a second power-on time of each scanning cycle in the use state; and if the first power-on time is greater than or equal to the second power-on time, triggering the processor to prompt an abnormality.

Figure 6:
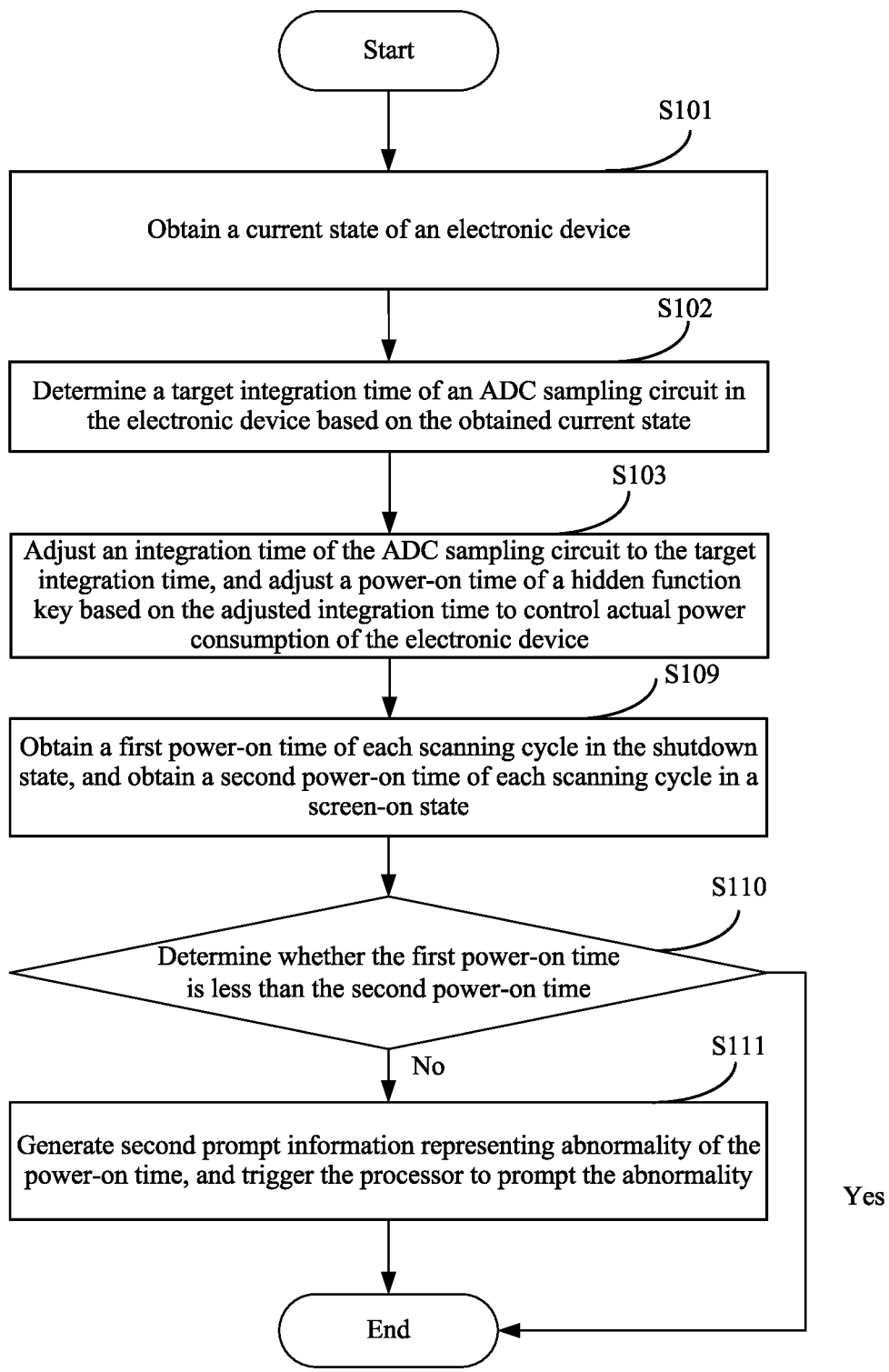
FIG. 6 is a schematic flowchart of a fourth embodiment of a power consumption control method for an electronic device according to a first aspect of this application.

In an optional implementation, the detection process of the power-on time in different use states may be performed by the sub-control circuit or the processor. In order to reduce change of a processing program of the processor, the power-on time detection in different use states performed by the sub-control circuit is used as an example. As shown in FIG. 6, after the adjusting an integration time of the ADC sampling circuit to the target integration time, and adjusting a power-on time of the hidden function key based on the adjusted integration time to control actual power consumption of the electronic device in S103, the method further includes the following steps.

S109. Obtain a first power-on time of each scanning cycle in the shutdown state, and obtain a second power-on time of each scanning cycle in the use state.

S110. Determine whether the first power-on time is less than the second power-on time.

If a determination result is no, then S111. generating second prompt information representing abnormality of the power-on time, and triggering the processor to prompt the abnormality is executed; Optionally, the second prompt information may be transmitted to the processor, so that the processor determines a cause of the abnormality and prompts the abnormality, and adjusts the parameters of the sub-control circuit based on the cause of the abnormality.

Optionally, the sub-control circuit controls the on-off of at least one power-consuming module in the key sensor, the amplification filter circuit, and the ADC sampling circuit through a timer and a control power supply, so as to adjust a power-on time of at least one power-consuming module in the key sensor, the amplification filter circuit, and the ADC sampling circuit in each scanning cycle; because the electronic device is in the shutdown state, the integration time of the ADC sampling circuit is short, but when the electronic device is in the use state, the integration time of the ADC sampling circuit is long, thus the first power-on time corresponding to the shutdown state should be less than the second power-on time corresponding to the use state; if it is detected that the first power-on time is greater than or equal to the second power-on time, it means that the control of the power-on time is abnormal, and the sub-control circuit may fail at this time, thus corresponding abnormal prompt information is automatically generated and transmitted to the processor, so that the processor automatically adjusts relevant parameters of the sub-control circuit in combination with specific abnormal causes; further, when a quantity of abnormal control of the power-on time is greater than the preset threshold, it means that the processor cannot automatically correct the relevant parameters, and the user may be prompted to carry out maintenance at a maintenance point.

According to the power consumption control method for an electronic device in the embodiments of this application, the method includes: obtaining a current state of the electronic device; determining a target integration time of an ADC sampling circuit based on the obtained current state; and adjusting an integration time of the ADC sampling circuit to the target integration time, and adjusting a power-on time of a hidden function key based on the adjusted integration time to control actual power consumption of the electronic device, where the integration time is positively correlated with the power-on time. In the embodiments of this application, the integration time of the ADC sampling circuit is adjusted in combination with the current state of the electronic device to adjust an on-off time of a power-consuming module in the hidden function key circuit, so as to reduce unnecessary power consumption of the electronic device. In this way, there is no need to change the sensor scanning frequency of the hidden function key, so that response sensitivity of the hidden function key can be ensured while the scanning frequency is kept unchanged, and the actual power consumption of the electronic device can also be reduced, thereby prolonging a standby time and a service life of the electronic device.

Figure 7:
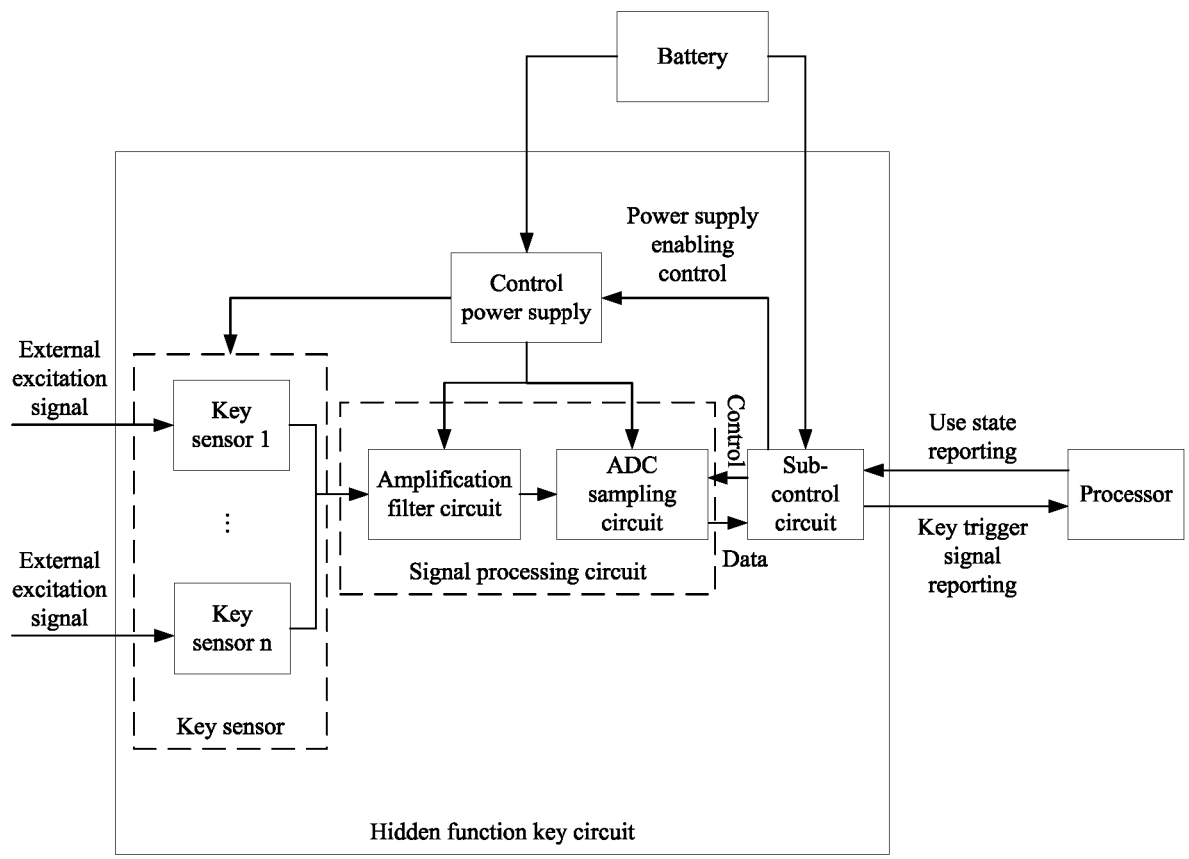
FIG. 7 is a schematic diagram of a circuit module composition of an embodiment of an electronic device according to a second aspect of this application.

Corresponding to the power consumption control method for an electronic device provided in the foregoing embodiments, based on the same technical concept, an embodiment of this application further provides an electronic device. FIG. 7 is a schematic diagram of a circuit module composition of an embodiment of an electronic device according to a second aspect of this application, and the electronic device is used to execute the power consumption control method for an electronic device described in FIG. 1 to FIG. 6. As shown in FIG. 7, the electronic device includes: hidden function key circuits and a processor.

The hidden function key circuits include: a sub-control circuit, and a plurality of key sensors electrically connected to the sub-control circuit, an amplification filter circuit, and an ADC sampling circuit.

The sub-control circuit is configured to:
obtain a current state of the electronic device transmitted by the processor, where the current state includes: a shutdown state, a standby state, and a use state;
determine a target integration time of the ADC sampling circuit based on the current state; and
adjust an integration time of the ADC sampling circuit to the target integration time, and adjust a power-on time of the hidden function key based on the adjusted integration time to control actual power consumption of the electronic device, where the integration time is positively correlated with the power-on time.

In the embodiments of this application, the integration time of the ADC sampling circuit is adjusted in combination with the current state of the electronic device to adjust an on-off time of a power-consuming module in the hidden function key circuit, so as to reduce unnecessary power consumption of the electronic device. In this way, there is no need to change the sensor scanning frequency of the hidden function key, so that response sensitivity of the hidden function key can be ensured while the scanning frequency is kept unchanged, and the actual power consumption of the electronic device can also be reduced, thereby prolonging a standby time and a service life of the electronic device.

Figure 8:
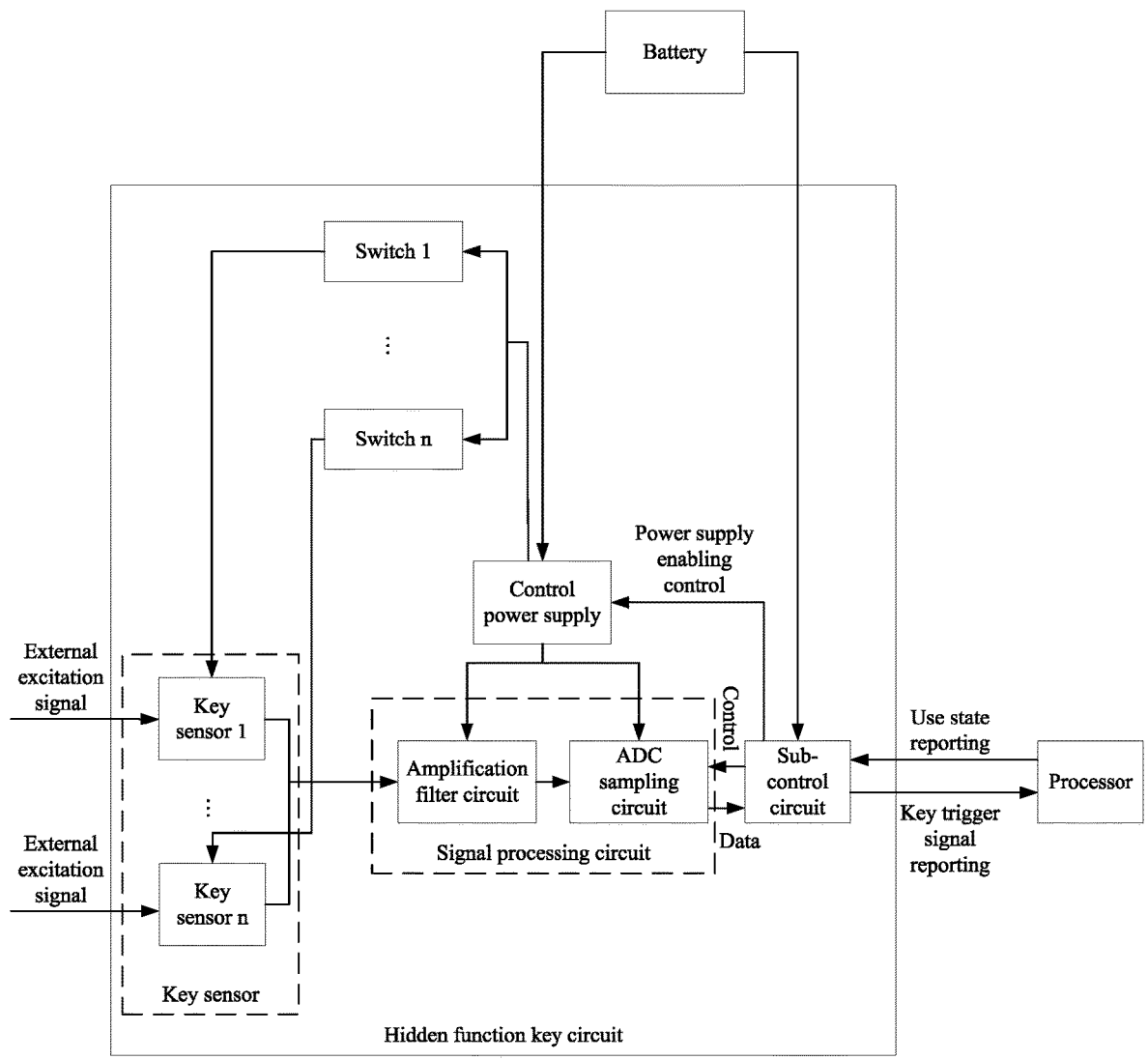
FIG. 8 is a schematic diagram of a circuit module composition of another embodiment of an electronic device according to a second aspect of this application.

In one or more embodiments, as shown in FIG. 8, the electronic device further includes: a plurality of switches for controlling on-off of the key sensor, and the switches are in one-to-one correspondence with the hidden function keys, where the sub-control circuit is further configured to:
determine a target hidden function key and a non-target hidden function key based on the current state; and
control the switch of the target hidden function key to be on, and control the switch of the non-target hidden function key to be off.

Optionally, the sub-control circuit is optionally configured to:
if the current state is the use state, determine a first integration time as the target integration time of the ADC sampling circuit in the electronic device;
if the current state is the standby state, determine a second integration time as the target integration time of the ADC sampling circuit in the electronic device; and
if the current state is the shutdown state, determine a third integration time as the target integration time of the ADC sampling circuit in the electronic device, where the first integration time is greater than the second integration time, and the second integration time is greater than the third integration time.

Optionally, the hidden function key includes: at least one of a hidden power key, a hidden volume up key, and a hidden volume down key; and the sub-control circuit is optionally configured to:
if the current state is the use state, determine all the hidden power key, the hidden volume up key, and the hidden volume down key as target hidden function keys; and
if the current state is the standby state or the shutdown state, determine the hidden power key as the target hidden function key, and determine the hidden volume up key and the hidden volume down key as non-target hidden function keys.

Optionally, the sub-control circuit is further configured to:
obtain a power-on time and a power-off time of a key sensor of a hidden function key in each scanning cycle; and
if a sum of the power-on time and the power-off time is not equal to a preset time threshold, prompt an abnormality.

Optionally, the sub-control circuit is further configured to:
obtain a first power-on time of each scanning cycle in the shutdown state, and obtain a second power-on time of each scanning cycle in the use state; and
if the first power-on time is greater than or equal to the second power-on time, prompt an abnormality.

The electronic device in the embodiments of this application is configured to obtain a current state of the electronic device; determine a target integration time of an ADC sampling circuit based on the obtained current state; and adjust an integration time of the ADC sampling circuit to the target integration time, and adjust a power-on time of a hidden function key based on the adjusted integration time to control actual power consumption of the electronic device, where the integration time is positively correlated with the power-on time. In the embodiments of this application, the integration time of the ADC sampling circuit is adjusted in combination with the current state of the electronic device to adjust an on-off time of a power-consuming module in the hidden function key circuit, so as to reduce unnecessary power consumption of the electronic device. In this way, there is no need to change the sensor scanning frequency of the hidden function key, so that response sensitivity of the hidden function key can be ensured while the scanning frequency is kept unchanged, and the actual power consumption of the electronic device can also be reduced, thereby prolonging a standby time and a service life of the electronic device.

The electronic device provided in the embodiments of this application can implement the processes in the embodiment corresponding to the power consumption control method for an electronic device. To avoid repetition, details are not described herein again.

It should be noted that the electronic device provided in the embodiments of this application and the power consumption control method for an electronic device provided in the embodiments of this application are based on a same inventive concept. Therefore, for the optional implementation of this embodiment, reference may be made to the foregoing implementation of the power consumption control method for an electronic device. Repeated parts are not described.

Corresponding to the power consumption control method for an electronic device provided in the foregoing embodiments, based on the same technical concept, a third aspect of this application further provides an electronic device for executing the power consumption control method for an electronic device. The electronic device includes a processor, a memory, and a computer program stored on the memory and executable on the processor, where the computer program, when executed by the processor, implements steps of each embodiment of the power consumption control method for an electronic device according to the first aspect, and the same technical effects can be achieved. To avoid repetition, details are not described herein again.

Figure 9:
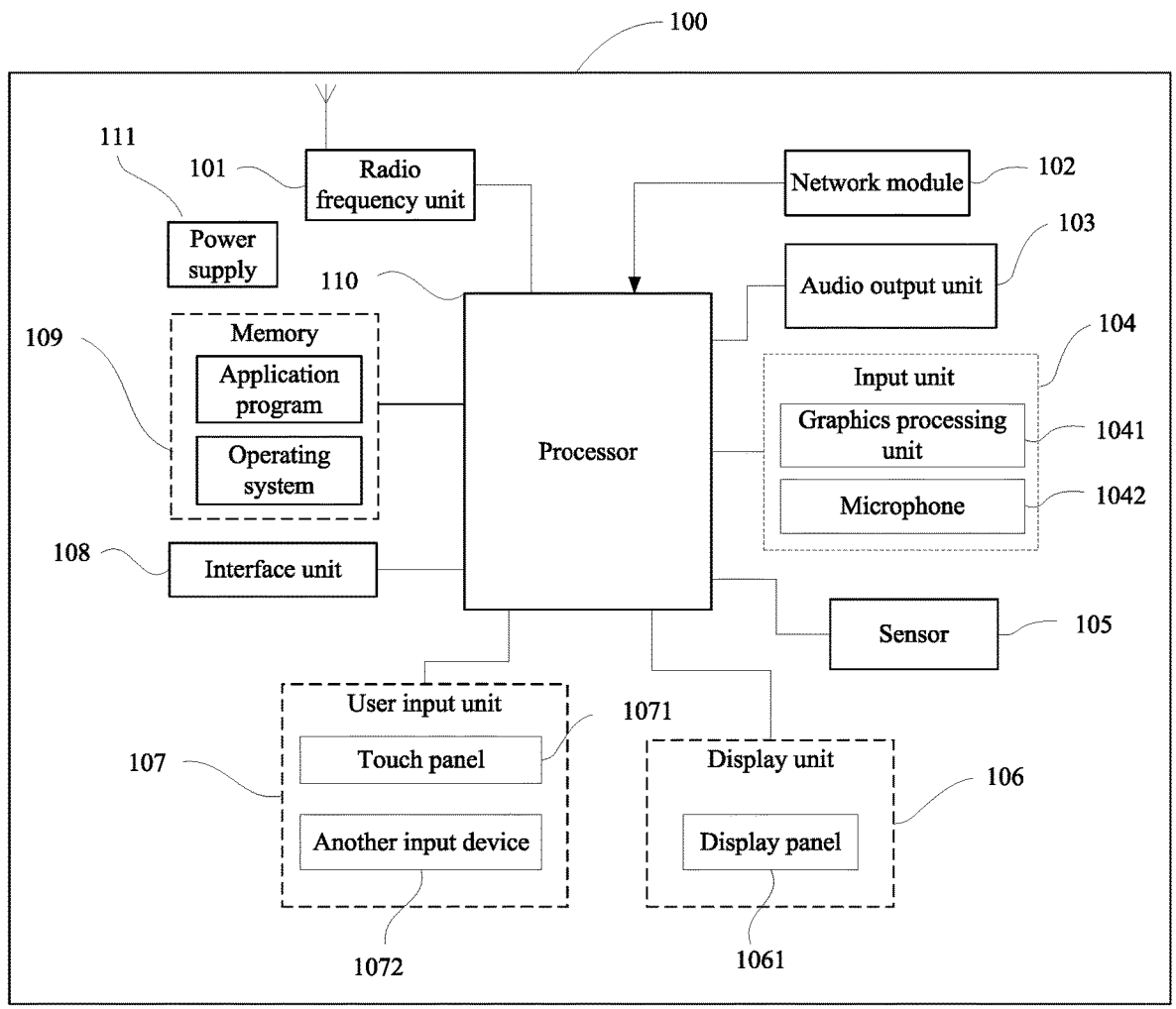
FIG. 9 is a schematic structural diagram of an embodiment of an electronic device according to a third aspect of this application.

FIG. 9 is a schematic structural diagram of an embodiment of an electronic device according to a third aspect of this application. The electronic device 100 shown in FIG. 9 includes but is not limited to: a radio frequency unit 101, a network module 102, an audio output unit 103, an input unit 104, a sensor 105, a display unit 106, a user input unit 107, an interface unit 108, a memory 109, a processor 110, a power supply 111, and other components. A person skilled in the art may understand that the structure of the electronic device shown in FIG. 9 constitutes no limitation on the electronic device. The electronic device may include more or fewer components than those shown in the figure, or a combination of some components, or an arrangement of different components. In this embodiment of this application, the electronic device includes but is not limited to a mobile phone, a tablet computer, a notebook computer, a palmtop computer, a vehicle-mounted terminal, a wearable device, a pedometer, or the like.

The processor 110 is a control center of the electronic device and connects all parts of the electronic device using various interfaces and circuits. By running or executing software programs and/or modules stored in the memory 109 and by calling data stored in the memory 109, the processor 110 implements various functions of the electronic device and processes data, thus performing overall monitoring on the electronic device. The processor 110 may include one or more processing units. Preferably, the processor 110 may be integrated with an application processor and a modem processor. The application processor mainly processes the operating system, the user interface, applications, and the like. The modem processor mainly processes wireless communication. It may be understood that the above-mentioned modem processor may not be integrated in the processor 110.

In this embodiment, the processor 110 is configured to:
obtain a current state of the electronic device, where the current state includes: a shutdown state, a standby state, and a use state;
determine a target integration time of an ADC sampling circuit in the electronic device based on the current state; and
adjust an integration time of the ADC sampling circuit to the target integration time, and adjust a power-on time of the hidden function key based on the adjusted integration time to control actual power consumption of the electronic device, where the integration time is positively correlated with the power-on time.

In the embodiments of this application, the integration time of the ADC sampling circuit is adjusted in combination with the current state of the electronic device to adjust an on-off time of a power-consuming module in the hidden function key circuit, so as to reduce unnecessary power consumption of the electronic device. In this way, there is no need to change the sensor scanning frequency of the hidden function key, so that response sensitivity of the hidden function key can be ensured while the scanning frequency is kept unchanged, and the actual power consumption of the electronic device can also be reduced, thereby prolonging a standby time and a service life of the electronic device.

The processor 110 is further configured to:
after obtaining the current state of the electronic device, determine a target hidden function key and a non-target hidden function key based on the current state; and
control a switch of the target hidden function key to be on, and controlling a switch of the non-target hidden function key to be off.

The processor 110 is further configured to:
determine a target integration time of an ADC sampling circuit in the electronic device based on the current state, including:
if the current state is the use state, determining a first integration time as the target integration time of the ADC sampling circuit in the electronic device;
if the current state is the standby state, determining a second integration time as the target integration time of the ADC sampling circuit in the electronic device; and
if the current state is the shutdown state, determining a third integration time as the target integration time of the ADC sampling circuit in the electronic device, where
the first integration time is greater than the second integration time, and the second integration time is greater than the third integration time.

The processor 110 is further configured to:
the plurality of hidden function key include: at least one of a hidden power key, a hidden volume up key, and a hidden volume down key;
determine a target hidden function key and a non-target hidden function key based on the current state, including:
if the current state is the use state, determining all the hidden power key, the hidden volume up key, and the hidden volume down key as target hidden function keys; and
if the current state is the standby state or the shutdown state, determining the hidden power key as the target hidden function key, and determining the hidden volume up key and the hidden volume down key as non-target hidden function keys.

The processor 110 is further configured to:
obtain a power-on time and a power-off time of a key sensor of a hidden function key in each scanning cycle; and
if a sum of the power-on time and the power-off time is not equal to a preset time threshold, prompt an abnormality.

The processor 110 is further configured to:
obtain a first power-on time of each scanning cycle in the shutdown state, and obtain a second power-on time of each scanning cycle in the use state; and
if the first power-on time is greater than or equal to the second power-on time, prompt an abnormality.

The electronic device 100 in the embodiments of this application is configured to obtain a current state of the electronic device; determine a target integration time of an ADC sampling circuit based on the obtained current state; and adjust an integration time of the ADC sampling circuit to the target integration time, and adjust a power-on time of a hidden function key based on the adjusted integration time to control actual power consumption of the electronic device, where the integration time is positively correlated with the power-on time. In the embodiments of this application, the integration time of the ADC sampling circuit is adjusted in combination with the current state of the electronic device to adjust an on-off time of a power-consuming module in the hidden function key circuit, so as to reduce unnecessary power consumption of the electronic device. In this way, there is no need to change the sensor scanning frequency of the hidden function key, so that response sensitivity of the hidden function key can be ensured while the scanning frequency is kept unchanged, and the actual power consumption of the electronic device can also be reduced, thereby prolonging a standby time and a service life of the electronic device.

It should be noted that the electronic device 100 provided in the embodiments of this application can implement the processes implemented by the electronic device in the embodiments of the power consumption control method for an electronic device. To avoid repetition, details are not described herein again.

It should be understood that, in the embodiments of this application, the radio frequency unit 101 may be configured to receive and transmit information, or receive and transmit signals during a call. Optionally, the radio frequency unit 101 receives downlink data from a base station, and transmits the downlink data to the processor 110 for processing; and in addition, transmits uplink data to the base station. Generally, the radio frequency unit 101 includes, but is not limited to, an antenna, at least one amplifier, a transceiver, a coupler, a low noise amplifier, and a duplexer. In addition, the radio frequency unit 101 may also communicate with a network and other devices through a wireless communication system.

The electronic device provides users with wireless broadband Internet access through the network module 102, for example, helps users receive and send e-mails, browse web pages, and access streaming media.

The audio output unit 103 may convert audio data received by the radio frequency unit 101 or the network module 102 or stored in the memory 109 into an audio signal and output the audio signal as a sound. Moreover, the audio output unit 103 may further provide audio output related to a specific function performed by the electronic device 100 (for example, a call signal receiving sound and a message receiving sound). The audio output unit 103 includes a speaker, a buzzer, a telephone receiver, and the like.

The input unit 104 is configured to receive audio or video signals. The input unit 104 may include a graphics processing unit (Graphics Processing Unit, GPU) 1041 and a microphone 1042, and the graphics processing unit 1041 processes image data of a still picture or video obtained by an image capture apparatus (such as a camera) in a video capture mode or an image capture mode. A processed image frame may be displayed on the display unit 106. The image frame processed by the graphics processing unit 1041 may be stored in the memory 109 (or another storage medium) or sent by using the radio frequency unit 101 or the network module 102. The microphone 1042 may receive a sound and can process such a sound into audio data. The processed audio data may be converted, in a phone calling mode, into a format that may be transmitted to a mobile communication base station by using the radio frequency unit 101 for output.

The electronic device 100 further includes at least one sensor 105, for example, a light sensor, a motion sensor, and another sensor. Optionally, the light sensor includes an ambient light sensor and a proximity sensor. The ambient light sensor may adjust brightness of a display panel 1061 according to ambient light brightness. The proximity sensor may switch off the display panel 1061 and/or backlight when the electronic device 100 moves close to an ear. As a motion sensor, an accelerometer sensor may detect magnitude of acceleration in various directions (usually three axes), may detect magnitude and the direction of gravity when stationary, may be configured to identify electronic device postures (such as switching between a landscape mode and a portrait mode, related games, and magnetometer posture calibration), may perform functions related to vibration identification (such as a pedometer and a knock), and the like. The sensor 105 may further include a fingerprint sensor, a pressure sensor, an iris sensor, a molecular sensor, a gyroscope, a barometer, a hygrometer, a thermometer, an infrared sensor, or the like. Details are not described herein again.

The display unit 106 is configured to display information entered by the user or information provided for the user. The display unit 106 may include a display panel 1061. The display panel 1061 may be configured in a form of a liquid crystal display (Liquid Crystal Display, LCD), an organic light-emitting diode (Organic Light-Emitting Diode, OLED), or the like.

The user input unit 107 may be configured to receive entered number or character information, and generate key signal input related to user settings and function control of the electronic device. Optionally, the user input unit 107 includes a touch panel 1071 and another input device 1072. The touch panel 1071, also called a touch screen, may collect touch operation on or near the touch panel by users (for example, operation on the touch panel 1071 or near the touch panel 1071 by fingers or any suitable objects or accessories such as a touch pen by the users). The touch panel 1071 may include two parts: a touch detection apparatus and a touch controller. The touch detection apparatus detects a touch position of a user, detects a signal brought by a touch operation, and transmits the signal to the touch controller. The touch controller receives touch information from the touch detection apparatus, converts the touch information into contact coordinates, sends the contact coordinates to the processor 110, and receives and executes a command from the processor 110. In addition, the touch panel 1071 may be implemented in a plurality of forms, such as a resistive type, a capacitive type, an infrared ray type or a surface acoustic wave type. In addition to the touch panel 1071, the user input unit 107 may further include other input devices 1072. Optionally, the other input devices 1072 may include but are not limited to: a physical keyboard, a function key (such as a volume control key, a switch key), a trackball, a mouse, and a joystick, which is no longer repeated here.

Further, the touch panel 1071 may cover the display panel 1061. When detecting a touch operation on or near the touch panel 1071, the touch panel 1071 transmits the touch operation to the processor 110 to determine a type of a touch event. Then, the processor 110 provides corresponding visual output on the display panel 1061 based on the type of the touch event. Although in FIG. 9, the touch panel 1071 and the display panel 1061 are configured as two independent components to implement input and output functions of the electronic device, in some embodiments, the touch panel 1071 and the display panel 1061 can be integrated to implement the input and output functions of the electronic device. Details are not limited herein.

The interface unit 108 is an interface for connecting an external apparatus and the electronic device 100. For example, the external apparatus may include a wired or wireless headset port, an external power supply (or a battery charger) port, a wired or wireless data port, a storage card port, a port configured to connect to an apparatus having an identification module, an audio input/output (I/O) port, a video 110 port, a headset port, and the like. The interface unit 108 may be configured to receive input from an external apparatus (for example, data information and power) and transmit the received input to one or more elements in the electronic device 100, or may be configured to transmit data between the electronic device 100 and the external apparatus.

The memory 109 may be configured to store a software program and various data. The memory 109 may mainly include a program storage area and a data storage area. The program storage area may store an operating system, an application required by at least one function (for example, a sound play function or an image display function), and the like. The data storage area may store data (for example, audio data or an address book) or the like created based on use of the mobile phone. In addition, the memory 109 may include a high-speed random access memory or a nonvolatile memory, for example, at least one disk storage device, a flash memory, or other volatile solid-state storage devices.

In this embodiment, the memory 109 may store a computer program, and when the processor 110 executes the computer program, steps of each embodiment of the power consumption control method for an electronic device according to the first aspect are implemented. Details are not described herein again.

The electronic device 100 may further include the power supply 111 (such as a battery) supplying power to each component. In an embodiment, the power supply 111 may be logically connected to the processor 110 by using a power management system, so as to implement functions such as charging management, discharging management and power consumption management by using the power management system.

In addition, the electronic device 100 includes some functional modules not shown. Details are not described herein again.

Further, corresponding to the power consumption control method for an electronic device provided in the foregoing embodiments, an embodiment of this application further provides a computer readable storage medium, where the computer readable storage medium stores a computer program, and the computer program, when executed by the processor 110, implements steps of each embodiment of the power consumption control method for an electronic device, and the same technical effects can be achieved. To avoid repetition, details are not described herein again. For example, the computer readable storage medium includes a non-transitory computer readable storage medium, such as a read-only memory (Read-Only Memory, ROM for short), a random access memory (Random Access Memory, RAM for short), a magnetic disk, an optical disc, or the like.

A person skilled in the art should understand that the embodiments of this application may be provided as methods, systems, or computer program products. Therefore, this application may use a form of hardware-only embodiments, software-only embodiments, or embodiments with a combination of software and hardware. Furthermore, this application may be in a form of a computer program product implemented on one or more computer-usable storage mediums (including but not limited to a disk memory, a CD-ROM, an optical memory, and the like) including computer-usable program code.

In a typical configuration, the computing device includes one or more processors (CPUs), an input/output interface, a network interface, and a memory.

The memory may include a non-permanent memory, a random access memory (RAM), and/or a non-volatile memory in the computer-readable medium, such as a read-only memory (ROM) or a flash memory (flash RAM). The memory is an example of the computer-readable medium.

For software implementation, the technology in the embodiments of this application may be implemented through modules (for example, procedures or functions) that perform the functions in the embodiments of this application. Software code may be stored in a memory and executed by a processor. The memory may be implemented inside or outside the processor.

It should further be noted that, in this specification, the terms "comprise", "include" and any other variants thereof are intended to cover non-exclusive inclusion, so that a process, a method, a commodity, or a device that includes a series of elements not only includes these very elements, but may also include other elements not expressly listed, or also include elements inherent to this process, method, commodity, or device. In the absence of more restrictions, an element defined by the statement "including a . . . " does not exclude another same element in a process, method, product, or device that includes the element.

Various aspects of the present disclosure are described with reference to the flowcharts and/or block diagrams of the method, the apparatus (system) and the computer program product in the embodiments of the present disclosure. It should be understood that each block in the flowchart and/or block diagram and a combination of blocks in the flowchart and/or block diagram may be implemented by a computer program instruction. These computer program instructions may be provided for a general-purpose computer, a dedicated computer, or a processor of another programmable data processing apparatus to generate a machine, so that when these instructions are executed by the computer or the processor of the another programmable data processing apparatus, specific functions/actions in one or more blocks in the flowcharts and/or in the block diagrams are implemented. Such a processor may be, but is not limited to a general purpose processor, a special purpose processor, an application specific processor, or a field programmable logic array. It should also be understood that each block in the block diagrams and/or flowcharts and combinations of the blocks in the block diagrams and/or flowcharts may also be implemented by a dedicated hardware-based system for executing specified functions or actions, or may be implemented by a combination of dedicated hardware and computer instructions.

The embodiments of this application are described above with reference to the accompanying drawings, but this application is not limited to the above optional implementations, and the above optional implementations are only illustrative and not restrictive. A person of ordinary skills in the art can make various modifications and changes in this application under the inspiration of this application without departing from the scope of this application and the scope of protection of the claims. Any modifications, equivalent substitutions, improvements, and the like made within the spirit and principle of this application should be included within the scope of the claims of this application.

The invention claimed is:

1. A power consumption control method for an electronic device, applied to an electronic device with a hidden function key, wherein the method comprises:
    obtaining a current state of the electronic device, wherein the current state comprises: a shutdown state, a standby state, and a use state;
    determining a target integration time of an ADC sampling circuit in the electronic device based on the current state; and
    adjusting an integration time of the ADC sampling circuit to the target integration time, and adjusting a power-on time of the hidden function key based on the adjusted integration time to control actual power consumption of the electronic device, wherein the integration time is positively correlated with the power-on time.

2. The method according to claim 1, wherein after the obtaining a current state of the electronic device, the method further comprises:
    determining a target hidden function key and a non-target hidden function key based on the current state; and
    controlling a switch of the target hidden function key to be on, and controlling a switch of the non-target hidden function key to be off.

3. The method according to claim 2, wherein the hidden function key comprises: at least one of a hidden power key, a hidden volume up key, and a hidden volume down key; and
the determining a target hidden function key and a non-target hidden function key based on the current state comprises:
if the current state is the use state, determining all the hidden power key, the hidden volume up key, and the hidden volume down key as target hidden function keys; and
if the current state is the standby state or the shutdown state, determining the hidden power key as the target hidden function key, and determining the hidden volume up key and the hidden volume down key as non-target hidden function keys.

4. The method according to claim 1, wherein the determining a target integration time of an ADC sampling circuit in the electronic device based on the current state comprises:
if the current state is the use state, determining a first integration time as the target integration time of the ADC sampling circuit in the electronic device;
if the current state is the standby state, determining a second integration time as the target integration time of the ADC sampling circuit in the electronic device; and
if the current state is the shutdown state, determining a third integration time as the target integration time of the ADC sampling circuit in the electronic device, wherein
the first integration time is greater than the second integration time, and the second integration time is greater than the third integration time.

5. The method according to claim 1, further comprising:
obtaining a power-on time and a power-off time of a key sensor of a hidden function key in each scanning cycle; and
if a sum of the power-on time and the power-off time is not equal to a preset time threshold, prompting an abnormality.

6. The method according to claim 1, further comprising:
obtaining a first power-on time of each scanning cycle in the shutdown state, and obtaining a second power-on time of each scanning cycle in the use state; and
if the first power-on time is greater than or equal to the second power-on time, prompting an abnormality.

7. An electronic device, comprising: hidden function key circuits and a processor, wherein
the hidden function key circuits comprise: a sub-control circuit, and a plurality of key sensors electrically connected to the sub-control circuit, an amplification filter circuit, and an ADC sampling circuit,
the sub-control circuit is configured to:
obtain a current state of the electronic device transmitted by the processor, wherein the current state comprises: a shutdown state, a standby state, and a use state;
determine a target integration time of the ADC sampling circuit based on the current state; and
adjust an integration time of the ADC sampling circuit to the target integration time, and adjust a power-on time of the hidden function key based on the adjusted integration time to control actual power consumption of the electronic device, wherein the integration time is positively correlated with the power-on time.

8. The electronic device according to claim 7, further comprising: a plurality of switches for controlling on-off of the key sensor, and the switches being in one-to-one correspondence with the hidden function keys, wherein
the sub-control circuit is further configured to:
determine a target hidden function key and a non-target hidden function key based on the current state; and
control a switch of the target hidden function key to be on, and control a switch of the non-target hidden function key to be off.

9. The electronic device according to claim 8, wherein the hidden function key comprises: at least one of a hidden power key, a hidden volume up key, and a hidden volume down key,
the sub-control circuit is further Optionally configured to:
if the current state is the use state, determine all the hidden power key, the hidden volume up key, and the hidden volume down key as target hidden function keys; and
if the current state is the standby state or the shutdown state, determine the hidden power key as the target hidden function key, and determine the hidden volume up key and the hidden volume down key as non-target hidden function keys.

10. The electronic device according to claim 7, wherein the sub-control circuit is Optionally configured to:
if the current state is the use state, determine a first integration time as the target integration time of the ADC sampling circuit in the electronic device;
if the current state is the standby state, determine a second integration time as the target integration time of the ADC sampling circuit in the electronic device; and
if the current state is the shutdown state, determine a third integration time as the target integration time of the ADC sampling circuit in the electronic device, wherein
the first integration time is greater than the second integration time, and the second integration time is greater than the third integration time.

11. The electronic device according to claim 7, wherein the sub-control circuit is further configured to:
obtain a power-on time and a power-off time of a key sensor of a hidden function key in each scanning cycle; and
if a sum of the power-on time and the power-off time is not equal to a preset time threshold, prompt an abnormality.

12. The electronic device according to claim 7, wherein the sub-control circuit is further configured to:
obtain a first power-on time of each scanning cycle in the shutdown state, and obtain a second power-on time of each scanning cycle in the use state; and
if the first power-on time is greater than or equal to the second power-on time, prompt an abnormality.

13. An electronic device, comprising a processor, a memory, and a computer program stored in the memory and executable on the processor, wherein when the computer program is executed by the processor, steps of the power consumption control method for an electronic device, wherein the method comprises:
obtaining a current state of the electronic device, wherein the current state comprises: a shutdown state, a standby state, and a use state;
determining a target integration time of an ADC sampling circuit in the electronic device based on the current state; and
adjusting an integration time of the ADC sampling circuit to the target integration time, and adjusting a power-on time of the hidden function key based on the adjusted integration time to control actual power consumption of the electronic device, wherein the integration time is positively correlated with the power-on time.

14. The electronic device according to claim 13, wherein after the obtaining a current state of the electronic device, the method further comprises:
- determining a target hidden function key and a non-target hidden function key based on the current state; and
- controlling a switch of the target hidden function key to be on, and controlling a switch of the non-target hidden function key to be off.

15. The electronic device according to claim 14, wherein the hidden function key comprises: at least one of a hidden power key, a hidden volume up key, and a hidden volume down key; and
- the determining a target hidden function key and a non-target hidden function key based on the current state comprises:
  - if the current state is the use state, determining all the hidden power key, the hidden volume up key, and the hidden volume down key as target hidden function keys; and
  - if the current state is the standby state or the shutdown state, determining the hidden power key as the target hidden function key, and determining the hidden volume up key and the hidden volume down key as non-target hidden function keys.

16. The electronic device according to claim 13, wherein the determining a target integration time of an ADC sampling circuit in the electronic device based on the current state comprises:
- if the current state is the use state, determining a first integration time as the target integration time of the ADC sampling circuit in the electronic device;
- if the current state is the standby state, determining a second integration time as the target integration time of the ADC sampling circuit in the electronic device; and
- if the current state is the shutdown state, determining a third integration time as the target integration time of the ADC sampling circuit in the electronic device, wherein
- the first integration time is greater than the second integration time, and the second integration time is greater than the third integration time.

17. The electronic device according to claim 13, wherein when the computer program is executed by the processor, the processor further implements:
- obtaining a power-on time and a power-off time of a key sensor of a hidden function key in each scanning cycle; and
- if a sum of the power-on time and the power-off time is not equal to a preset time threshold, prompting an abnormality.

18. The electronic device according to claim 13, wherein when the computer program is executed by the processor, the processor further implements:
- obtaining a first power-on time of each scanning cycle in the shutdown state, and obtaining a second power-on time of each scanning cycle in the use state; and
- if the first power-on time is greater than or equal to the second power-on time, prompting an abnormality.

19. A non-transitory computer readable storage medium, wherein the computer readable storage medium stores a computer program, and when the computer program is executed by a processor, steps of the power consumption control method for an electronic device according to claim 1.

20. A non-transitory computer readable storage medium, wherein the computer readable storage medium stores a computer program, and when the computer program is executed by a processor, steps of the power consumption control method for an electronic device according to claim 2.

* * * * *